United States Patent
Thaler et al.

(10) Patent No.: US 10,534,268 B2
(45) Date of Patent: Jan. 14, 2020

(54) METHOD FOR CORRECTING THE CRITICAL DIMENSION UNIFORMITY OF A PHOTOMASK FOR SEMICONDUCTOR LITHOGRAPHY

(71) Applicants: Carl Zeiss SMT GmbH, Oberkochen (DE); Carl Zeiss SMS Ltd., Misgav (IL)

(72) Inventors: Thomas Thaler, Jena (DE); Joachim Welte, Darmstadt (DE); Kujan Gorhad, Kfar Kama (IL); Vladimir Dmitriev, Tzurit (IL); Ute Buttgereit, Jena (DE); Thomas Scheruebl, Jena (DE); Yuval Perets, Moshav Beit Shearim (IL)

(73) Assignees: Carl Zeiss SMT GmbH, Oberkochen (DE); Carl Zeiss SMS Ltd., Misgav (IL)

( * ) Notice: Subject to any disclaimer, the term of this patent is extended or adjusted under 35 U.S.C. 154(b) by 0 days.

(21) Appl. No.: 16/152,784

(22) Filed: Oct. 5, 2018

(65) Prior Publication Data

US 2019/0107783 A1   Apr. 11, 2019

(30) Foreign Application Priority Data

Oct. 5, 2017 (DE) .......................... 10 2017 123 114

(51) Int. Cl.
*G03F 7/20* (2006.01)
(52) U.S. Cl.
CPC ................ *G03F 7/70191* (2013.01)
(58) Field of Classification Search
CPC .... G03F 7/70191; G03F 7/20; G03F 7/70591; G03F 7/70633

USPC ............................................... 355/52, 53, 55
See application file for complete search history.

(56) References Cited

U.S. PATENT DOCUMENTS

| | | | |
|---|---|---|---|
| 2006/0134529 A1* | 6/2006 | Hansen | G03F 7/70425 430/5 |
| 2012/0009511 A1 | 1/2012 | Dmitriev | |
| 2013/0215404 A1* | 8/2013 | Den Boef | G01J 3/4412 355/44 |
| 2015/0144798 A1 | 5/2015 | Shi et al. | |

FOREIGN PATENT DOCUMENTS

DE    102011078927    1/2012

OTHER PUBLICATIONS

German Examination Report for German Application No. 10 2017 123 114.5 dated May 18, 2018.

* cited by examiner

*Primary Examiner* — Hung Nguyen
(74) *Attorney, Agent, or Firm* — Fish & Richardson P.C.

(57) ABSTRACT

The invention relates to a method for correcting the critical dimension uniformity of a photomask for semiconductor lithography, comprising the following steps:
  determining a transfer coefficient as a calibration parameter,
  correcting the photomask by writing pixel fields,
  verifying the photomask corrected thus,
  wherein a transfer coefficient is used for verifying the corrected photomask, said transfer coefficient being obtained from a measured scattering function of pixel fields.

11 Claims, 4 Drawing Sheets

(a)    (b)

(a)    (b)

METHOD FOR CORRECTING THE CRITICAL DIMENSION UNIFORMITY OF A PHOTOMASK FOR SEMICONDUCTOR LITHOGRAPHY

CROSS-REFERENCE TO RELATED APPLICATIONS

This application claims priority under 35 U.S.C. § 119 from German Application DE 10 2017 123 114.5, filed on Oct. 5, 2017, the entire content of which is incorporated herein by reference in its entirety.

TECHNICAL FIELD

This description relates to correction of critical dimension uniformity of a photomask for semiconductor lithography.

BACKGROUND

Electrical components consist of a plurality of structured layers, which are created individually and in succession until the component is completed. Each layer is transferred onto a semiconductor substrate, the so-called wafer, by photolithography, with a so-called mask serving as a template in each case. In general, a mask comprises a transparent carrier material, for example quartz glass, and a non-transparent material, generally referred to as an absorber. This absorber is structured such that it produces bright and dark regions on the wafer when the mask is imaged. A photosensitive layer on the wafer, the so-called resist, reacts with the incident light, as a result of which the resist is structured in accordance with the mask template. Hence, the desired structures ultimately arise on the wafer.

A widespread problem when structuring the absorber on the mask consists of producing the structures exactly according to the dimensional specifications. As a rule, real masks have a certain variance, for example in a line width which, according to the prescriptions, should be constant. Here, the so-called CDU (critical dimension uniformity) is a measure for the line width variance. This measure decisively determines the quality of the mask. If the CDU of a mask exceeds a certain measure, the mask counts as non-usable and hence as a reject because the uniformity of the line widths on the wafer plays a decisive role for a high yield of functioning electrical components. What makes matters even more difficult here is that, as a result of the lithographic method in the scanner, the line width variance produced on the wafer by the mask is higher than the line variance of the absorber on the mask by a factor, the so-called mask error enhancement factor (MEEF).

Although etching methods can be used to modify the structures on the mask to a certain extent within spatially tightly delimited regions, the problem of a larger-area modification regularly arises. Therefore, according to the prior art, the so-called CDC (critical dimension control) tool is used for such modifications. Local scattering centers, so-called pixels, or whole regions with pixels, i.e., changes in the material structure of the mask, are written by use of the CDC tool using a femtosecond laser. Usually, regions provided with pixels with diameters in the region of several millimeters or centimeters should be created. Since the pixels are written into the quartz glass and consequently found in the optical path upstream of the absorber, the incident light is scattered at these pixels during the exposure process, as a result of which some of the light no longer reaches the absorber of the mask. Consequently, the intensity of the light reaching the absorber is influenced by varying the pixel density. The intensity changes triggered hereby in turn cause a line width change on the wafer during the exposure process. Should the intensity with which the absorber is exposed now be modulated using this technique in accordance with the known CDU of the mask, it is possible to compensate the line variance of the mask for the imaging in the scanner. Expressed differently, by writing the pixels, the line width that physically deviates on the mask is corrected on the image that is created on the wafer. However, the absorber on the mask is not physically modified in the process; instead, all that changes is the imaging thereof when exposing the wafer in the scanner.

Usually, the CDU is measured during the production process of the mask. This is brought about, inter alia, with the aid of a mask metrology device, i.e., an optical apparatus that emulates the most important optical properties of a scanner and therefore inherently captures some of the effects contributing to the aforementioned MEEF. Examples of these apparatuses include the wafer level critical dimension measuring appliance, abbreviated WLCD, and the aerial image measurement system, abbreviated AIMS™, with the first being used in dedicated fashion for measuring the CDU.

SUMMARY

Certain technical differences between the WLCD and the scanner lead to the pixels introduced by the CDC tool having different optical effects in the two apparatuses. In order to be able to take account of these differences in WLCD measurements, a calibration on the basis of wafer data is necessary. However, obtaining wafer data requires much outlay and time, which is why it is advantageous to undertake this calibration in a different way.

In a general aspect, the present invention specifies an efficient method for calibrating the difference in the optical effect of the pixels between WLCD and scanner.

The object of the invention is achieved by a device having the features of independent claim 1. The dependent claims concern advantageous developments and variants of the invention.

The method according to the invention for correcting the critical dimension uniformity of a photomask for semiconductor lithography comprises the following steps:
determining the CDU to be corrected by way of a scanner-equivalent CDU measurement,
determining the transfer coefficient as a calibration parameter,
correcting the mask by writing pixel fields,
verifying the photomask corrected thus,
wherein a transfer coefficient which is obtained from a scattering function of pixel fields measured in advance is used for verification purposes, i.e., for checking the effects of writing the pixel field into the mask corrected thus.

Implementations of the invention can include one or more of the following features. Here, for the purposes of determining the transfer coefficient, the scattering function can be integrated within the respectively applicable integration limits, in particular over scattering angle and angle of incidence for a WLCD and over scattering angle and angle of incidence for a scanner.

Here, the scattering function is dependent, inter alia, on the device used to write the pixel fields and the operating parameters of said device; i.e., it can vary by all means for different devices and different tools.

Furthermore, forming a quotient from the respective results of the integration can be undertaken for the purposes of determining the transfer coefficient.

For verification of the photomask, the transfer coefficient and an evaluation of a diffraction pattern caused by regular structures on the mask can be used in an advantageous variant of the invention; here, the evaluation may comprise a comparison of the absolute intensities of diffraction maximums before and after writing the pixel fields.

The method according to the invention makes use of the already available AIMS (aerial image management system) and WLCD (wafer level critical dimension) systems to optically measure the mask, in particular to evaluate the CDU and the distribution thereof (CDU map) over a mask. This system uses the same illumination conditions as the scanner in respect of illumination schemes in the pupil, wavelength, numerical aperture (NA), etc. However, an aspect during the exposure not emulated by the system is the simultaneously exposed area of the mask during the measurement. The reason for the different optical effect of the pixels in the WLCD and in the scanner can also be found here. However, no pixels are present yet in the mask at this point.

In the next step, the CDU, which is measured by the WLCD and which is to be corrected, is converted into an attenuation distribution over the mask, which is to be generated by the CDC tool, said attenuation distribution over the mask then being used in the subsequent CDC process for the purposes of modifying the mask. Subsequently, a verification measurement is undertaken by use of the WLCD process in order to complete the closed loop. At this stage, the different illumination field dimensions specified at the outset play a role.

The illumination field in the scanner is greater than in the WLCD. As a result, a larger area around a measurement position is exposed at the same time, as result of which pixels at positions on the mask that are situated further away from the measurement position are also exposed. Stray light under different angles is produced at each exposed pixel. Consequently, even a distant pixel can produce stray light, which, in turn, is incident at the actual measurement position and consequently produces an intensity contribution at the measurement position.

However, as a result of the smaller illumination field, pixels situated further away from the measurement position are not exposed in the WLCD, as a result of which said pixels cannot produce stray light which would make an intensity contribution to the measurement position in the scanner. For this reason, a certain pixel density in the WLCD brings about higher light attenuation than the same pixel density in the scanner. The approach of capturing this difference and taking it into account for WLCD measurements consists of calibrating the ratio of the appliance-specific light attenuation. This ratio is also referred to as the transfer coefficient. Previously, this was only possible by way of a comparison of the scanner results with the WLCD results.

The novel solution approach to this end now consists of measuring the angle-dependent scattering behaviour of the pixel fields in advance, which can be implemented, in particular, by use of an ellipsometer, e.g., by use of a Woollam ellipsometer. This measurement supplies a scattering function which completely describes the angle-dependent scattering behaviour of a pixel field for different angles of incidence. The obtained scattering function is also referred to as a kernel. It describes what stray light intensities are produced under what scattering angles if a light beam with a known angle of incidence is incident on a pixel field with a known pixel density.

For example, a laser beam having an intensity $I_{in}$ is directed toward a substrate having a pixel field, and after passing the substrate the beam intensity $I_{out}$ is measured The kernel K depends on the entering angle $\alpha$ and the exit angle $\varphi$, represented by $I_{out}=K(\alpha, \varphi) \times I_{in}$. For example, the kernel K may depend on the spacing of the pixels in the substrate. In some implementations, a mask blank with a pixel array is prepared and measured on the ellipsometer to derive $K(\alpha, \varphi)$ for a wide range of $\alpha$ and $\varphi$.

Consequently, the kernel is a tool-independent description of the optical behaviour of the pixels and hence it is able to describe the different optical effects of the pixels under different conditions, such as, e.g., in the scanner and in the WLCD. To this end, only the boundary conditions of, in particular, the different illumination fields of the respective apparatus need to be taken into account in addition to the employed illumination scheme. The maximum stray light angle, under which stray light that contributes to the intensity at the measurement position is generated in the respective system, can be calculated from the illumination field dimension. For example, using the kernel $K(\alpha, \varphi)$ described above, different apparatuses may have different ranges of the entering angles $\alpha$ and different ranges of exit angles $\varphi$. Now, the portion of the light that still arrives at the measurement position is obtained by integrating the stray light intensities over the kernel, which stray light intensities arise between 0 and the maximum scattering light angle of the tool, and by comparing this value with the incident light. The difference in the intensity of this light and the intensity of the light incident on the pixel area is the intensity that is lost by scattering. The quotient of the intensity of the lost light to the intensity of the incident light is the light attenuation for a pixel area in the considered system. Accordingly, the same calculation can also be undertaken for the respective other system, with a different maximum stray light angle applying as a result of a different illumination area. The quotient of the apparatus-specific attenuation values then corresponds to the transfer coefficient.

In the verification step, the effect of the pixels on the scanner CD should be determined by use of WLCD measurements. To this end, the WLCD measurements are carried out in accordance with the scanner prescriptions in respect of NA, illumination, etc. By way of a comparison of the measurements at a point before and after the introduction of the pixels by way of the CDC tool, it is possible to determine the optical effect of the pixels in respect of the attenuation for the WLCD. By way of the transfer coefficient, the effective attenuation, which will act on the scanner, can be calculated therefrom. By way of a corresponding adaptation of the evaluation threshold in the image measured by the WLCD, this allows the equivalent CD value for the scanner to be determined.

Here, it may be sufficient to measure the scattering characteristics of the pixels for a CDC tool. Under the assumption that the CDC tools, among themselves, produce comparable pixels and the pixels produced by a CDC tool remain stable over the service life of a tool, there can then be an estimate of the scattering behaviour for a multiplicity of cases of application. It is likewise conceivable that there can also be tool-specific and time-limited kernels, which would then have to be taken into account during further use of the kernel.

In parallel with the aforementioned measurement method in the mask metrology device, such as, e.g., in the AIMS and WLCD, use is made of a further measurement method, the so-called CDrun method, which can be applied in the two aforementioned apparatuses. In contrast to the aforementioned methods, in which the intensity distribution generated by the mask is measured directly, this measurement method is based on capturing and evaluating the intensity values of the orders of diffraction that are generated by the mask. The advantage of this measurement method is that it can be implemented quicker in comparison with the above-described method. Using it, the CDU measurement of a mask can be carried out at a plurality of measurement points within the same time. A boundary condition of this method is that the structures to be measured produce dedicated orders of diffraction that are spatially separated in the pupil. As a rule, reference is then made to so-called regular structures, such as, e.g., optical gratings or contact holes arranged on a regular lattice.

Furthermore, this measurement method is based on an adapted illumination scheme in the pupil, by use of which it likewise differs from the measurement method specified first. As a rule, an illumination spot that is as small as possible, a so-called monopole, in the pupil is used to expose the mask and consequently implement the measurements. On the imaging side, the optical design of the mask metrology device is adapted in such a way that now the pupil, instead of the field, is imaged on the camera of the apparatus. If a regular structure is illuminated by the monopole, dedicated orders of diffraction arise at the absorber of the mask. Some of these orders of diffraction are thereupon imaged as far as the camera of the measurement apparatus by way of the imaging. Here, these appear as further illumination spots, the distance from one another being determined, in particular, by the lattice constant of the regular structure. The arising orders of diffraction are numbered as a rule, with the zero order of diffraction corresponding to the component of the incident light passing through the mask without being diffracted. The position of the zero order of diffraction in the pupil therefore corresponds to the position of the incident light and can be uniquely determined thereby.

The object of this measurement method, just like that of the preceding one, is to determine the CDU of a mask. In this measurement method, a measure to this end is the ratio of the intensity of the first order of diffraction to that of the zero order of diffraction. Changes in this ratio can be calibrated on CD changes on the mask. Therefore, this measurement method can be advantageously combined with the preceding measurement method. Here, in a first step, all measurement positions of the mask are measured using the CDrun method and the distribution of the ratios of the orders of diffraction over the mask are determined. In a second step, the measured orders of diffraction ratio region is subdivided into a fixed number of portions and exemplary measurements are carried out in each portion according to the measurement method described first and the CD at the measurement position is determined. These CD values are then correlated to the measured orders of diffraction ratios and a regression function is calculated. This regression function now serves to convert the measured orders of diffraction ratios into CD values on the mask, as a result of which the CDU distribution of the mask is now known. The latter is then corrected by the CDC tool, as already described above.

As a result of the modified measurement method, the verification by use of CDC tool is implemented differently than in the preceding measurement method. The already described difference in the illumination field dimensions and the optical effect of the pixels resulting therefrom continue to exist in the process. However, there is a different effect of the difference on the CDrun measurement than in the preceding measurement method. The attenuation caused by the introduced pixels has a homogeneous effect on the entire pupil. Therefore, all intensities in the pupil are attenuated by the same factor. The ratio of the order of diffraction intensities used to determine the CD at a measurement position however remains constant prior to and after the introduction of the pixels as a result thereof. Therefore, the measurement method described here is insensitive in relation to the pixels and cannot be used in this form to verify the CDC process.

The solution approach to this end now consists of calculating the attenuation effective in the WLCD from the CDrun measurements before and after the CDC process. To this end, the ratio of the intensity of the zero order of diffraction of the measurement at one point before the CDC process to said intensity at the same point after the CDC process should be formed. The ratio corresponds to the attenuation in the AIMS or WLCD. By way of the transfer coefficient, which is determined in a manner similar to the aforementioned method but with the additional consideration of the different illumination schemes, it is now possible to calculate the effective attenuation in the scanner. From the aforementioned calibration measurement, a field measurement is used in prototype fashion for the next step. Here, it is irrelevant whether the prototype was recorded at the same point or at a different position on the mask. Now, in said prototype, the intensity value at which the average CD of the structures in the measurement correspond to the CD value which was measured in the CDrun measurement prior to the CDC process at the point to be verified is determined. This intensity value can now be accordingly adapted by way of the previously calculated effective attenuation in the scanner. Then, the CD analysis should be repeated with this adapted intensity value. The CD value obtained therefrom now corresponds to the CD value in the scanner after the CDC process. The just-described steps, specifically calculating the effective attenuation from the CDrun measurements, calculating the effective attenuation of the scanner by way of the transfer coefficient, finding the intensity in a prototype measurement, adapting the intensity according to the effective attenuation in the scanner and implementing a final CD evaluation using the adapted intensity value, can now be repeated for each measurement position, as a result of which a CDU map arises, said CDU map corresponding to the CDU map in the scanner during the exposure of the mask treated by the CDC. Consequently, the verification of the CDC process can also be implemented in the case of CDrun measurements.

In some implementations, after the CD uniformity of a photomask is verified, if the CD uniformity has not been sufficiently corrected by the pixels according to specification, the photomask can be further corrected or set aside and not used. For example, the specification may specify that the CD uniformity needs to meet certain criteria. For example, the system 100 can write another set of pixels having different parameters (e.g., shape, depth in the blank, or size) to try to improve the CD uniformity. Alternatively, the system 100 may incorporate a different repair mechanism. For example, a tool may be used to change the structure of the photomask by etching or deposition to repair discreet erroneous positions on the photomask.

BRIEF DESCRIPTION OF DRAWINGS

Below, aspects of the invention and employed terms are once again explained and illustrated in more detail on the basis of the drawing. In the figures.

DETAILED DESCRIPTION

This document describes an improved system and method for correcting the critical dimension uniformity of a substrate, such as a photomask for lithography. The invention improves the functionality of the system by enabling the system to properly verify whether the CD uniformity of a substrate has been adequately corrected. If the CD uniformity after correction does not meet a predetermined specification, the system can further correct the CD uniformity of the substrate in subsequent process(es). The inventive process takes into account the different illumination schemes for a mask metrology device and a scanner when determining a transfer coefficient used in the verification process.

Figure 1:
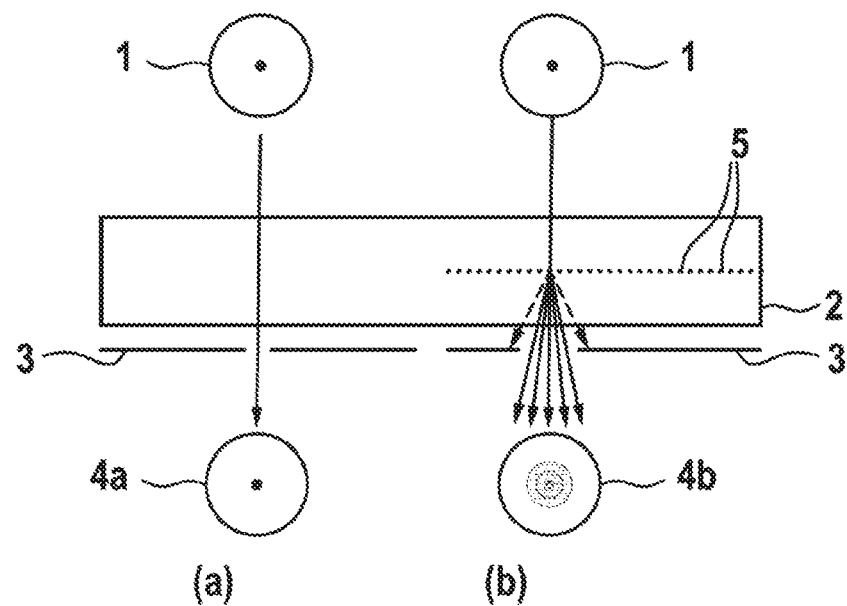
FIG. 1 shows the real illumination conditions in a scanner for cases with and without a written pixel field.

In partial figures (a) and (b), FIG. 1 elucidates the real illumination conditions in a scanner, with a punctiform illumination scheme 1 in the present example. The left partial figure (a) illustrates the case in which no pixels and no other further structures are present in a photomask 2—the entry pupil 3 of the projection lens sees the unmodified, punctiform illumination distribution 4a.

This should be distinguished from the case illustrated in the right partial figure (b), in which the photomask 2 has been provided with a pixel field 5. In comparison with the case without pixels, the entry pupil 3 of the projection lens sees an illumination distribution 4b that has been significantly modified, both in terms of intensity and in terms of form. Illustrated by dashed lines are those components of the illumination light which do not pass the entry pupil 3 and which consequently are not available for exposing the wafer. This illumination distribution now can be established on the basis of the kernel, established by the measurement, as a function of the illumination setting (i.e., the intensity distribution of the illumination light). The modified illumination distribution 4b caused by the pixels then is incident on the mask structures on the mask lower side, not illustrated in the figure, along the further path of the radiation used for imaging. It is possible to recognize a certain amount of smearing in the illumination distribution and a distribution of the illumination intensity over a broader spatial region than in the case where the mask does not have any pixels. Particularly in conjunction with the properties of the employed photoresist on the wafer, in particular the intensity threshold of the exposure radiation that is required for reaction of the photoresist, the CDU can be influenced in this manner by virtue of the surface regions on the wafer, on which the intensities of the radiation that exceed the intensity threshold are incident, being reduced. As a result, this also reduces the effectively exposed line width on the wafer, and so the CDU can be adapted in this way.

Figure 2:
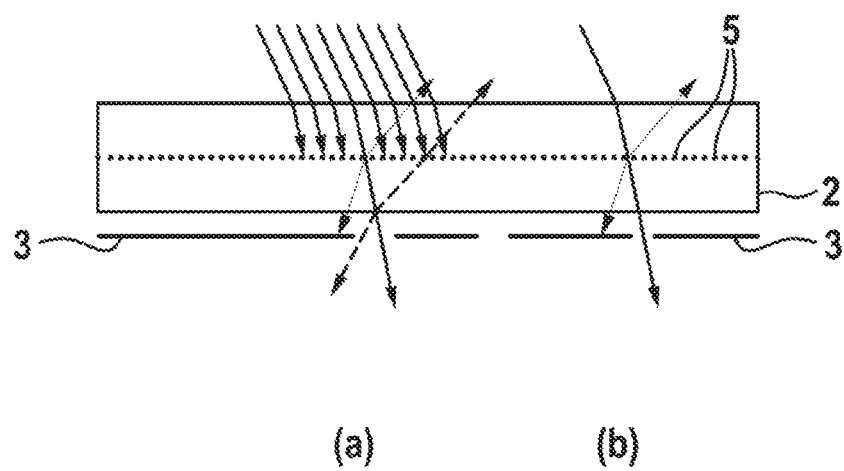
FIG. 2 shows the different extents of an illumination field for a scanner and WLCD.

As illustrated in partial figures (a) and (b) in FIG. 2, the scanner and WLCD differ, however, in the terms of the extent of the illumination field, as already mentioned at the outset. As a result, stray light arises at more distant pixels of the pixel field 5 in the scanner, said stray light, in turn, being incident in the lens 3 of the scanner having been scattered at a greater angle and therefore partly counteracting the attenuation effect of the pixel field 5. These conditions are elucidated, once again, on the basis of the arrow, drawn with dashed lines, in FIG. 2(a). As can be identified from FIG. 2(b), no stray light that is incident in the lens 3 at this angle arises in the WLCD since the pixels that would produce this stray light are not illuminated in the WLCD on account of the smaller illumination field. If the intent is now to determine the effective attenuations or intensities for the WLCD and the scanner, as produced by the pixel field, it is sufficient to integrate the kernel over the respective tool-specific integration limits of the illumination directions. Expressed differently, the integration limits of the integral contain the necessary information about the tool-specific extent of the illumination field for the WLCD and the scanner.

Figure 3:
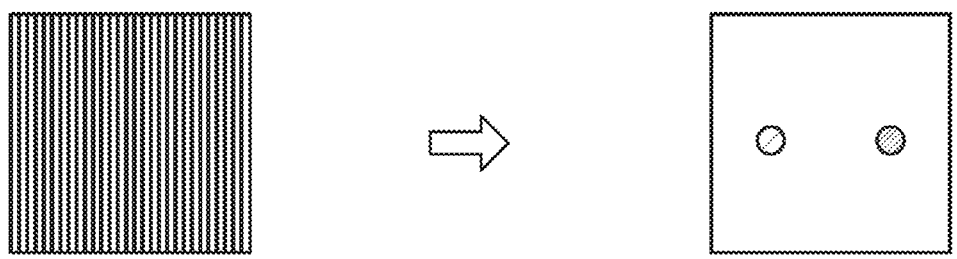
FIG. 3 shows a regular lines-and-spaces structure on a photomask and the diffraction image thereof.

In partial figure (a), FIG. 3 shows, in an exemplary manner, a regular lines-and-spaces structure used for the CDrun method and, in partial figure (b), it shows the diffraction image arising in the pupil; the zero and the first order of diffraction are clearly visible.

As already mentioned previously, a change of the CD within the mask structure is reflected in a change in the ratios of the intensities of the zero and the first order of diffraction of the diffraction pattern.

Figure 4:
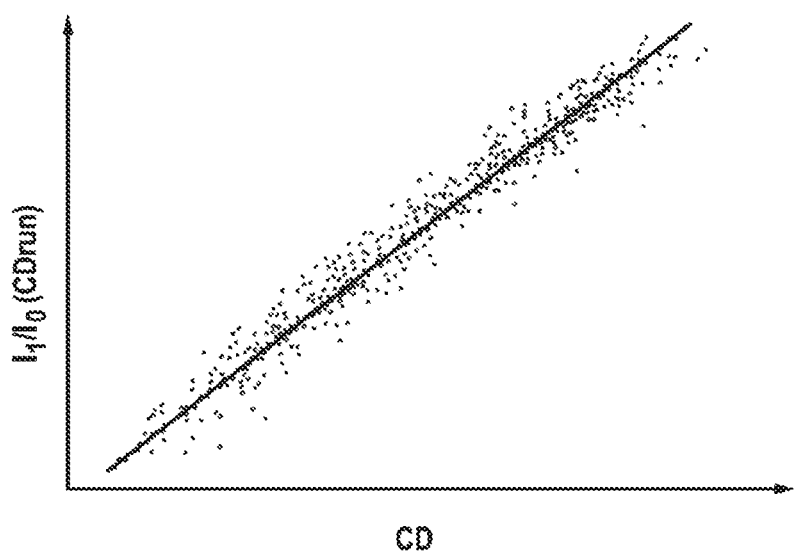
FIG. 4 shows a plot of the ratio of the intensities of orders of diffraction against a measured CDU.

FIG. 4 shows a plot of the ratio of the intensities of the orders of diffraction in the pupil over the average CD values, likewise established by use of the WLCD but established by use of aerial image measurements; this calibration renders it possible to assign a CD change to any change in the ratio of the intensities.

Figure 5:
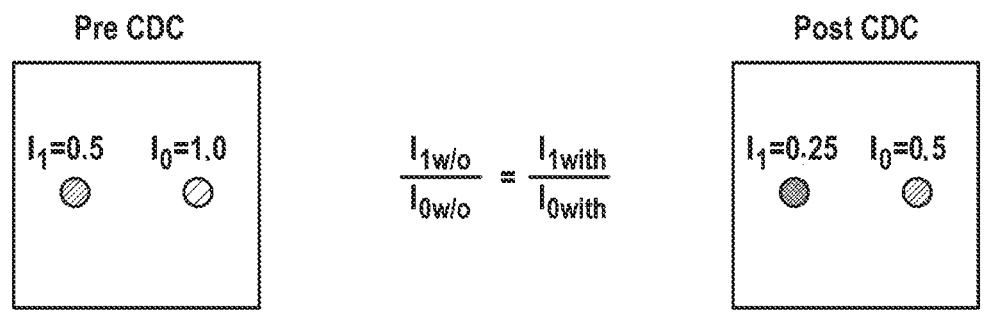
FIG. 5 shows an elucidation of the constant ratio of the intensity of the zero and first diffraction maximum.

The effects of writing a pixel field into the mask are once again elucidated on the basis of FIG. 5. It is possible to recognize that the effect of this process lies in a general intensity attenuation of both orders of diffraction of the diffraction pattern. However, the ratio of the two intensities remains unchanged as both intensities are attenuated by the same factor.

Figure 6:
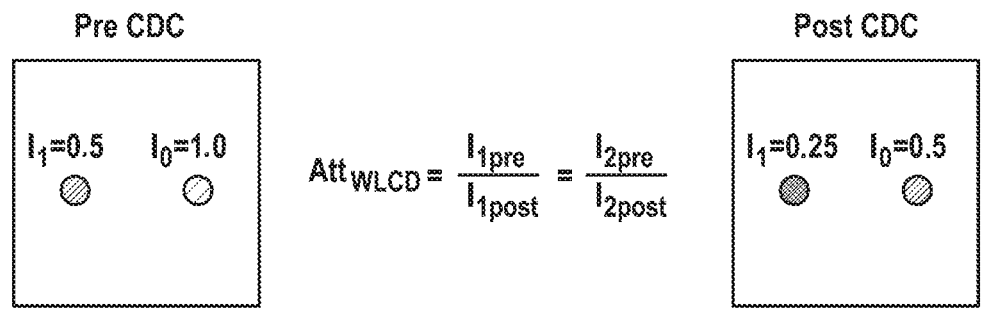
FIG. 6 shows an elucidation of the absolute attenuation of the intensities of the diffraction maximums caused by the CDC process.

FIG. 6 illustrates the option of comparing the established absolute intensities before the CDC process and after the CDC process and of establishing a percentage or relative attenuation therefrom.

Figure 7:
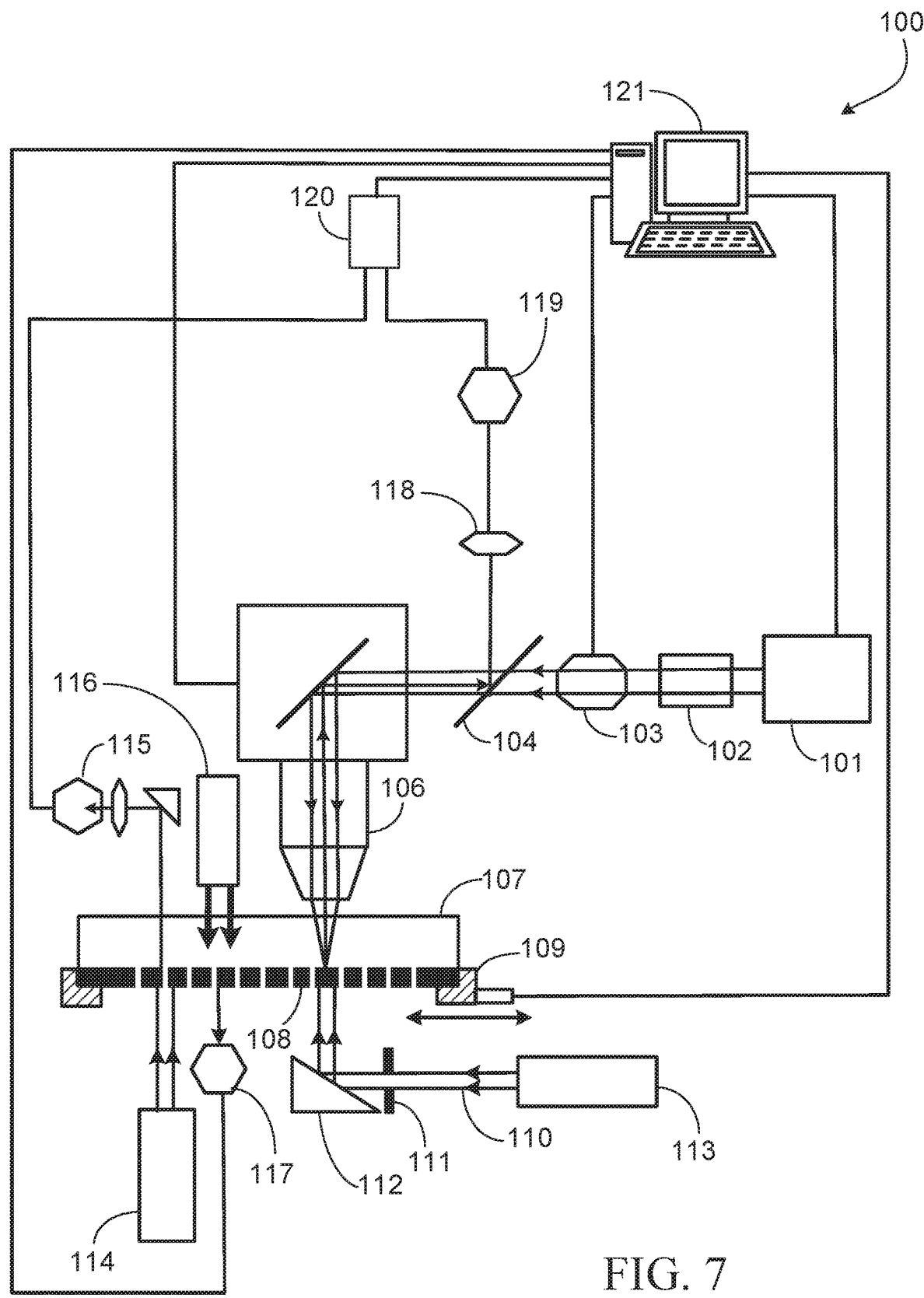
FIG. 7 shows an example system for correcting the critical dimension uniformity of a substrate.

Referring to FIG. 7, in some implementations, a system 100 is provided for correcting the critical dimension uniformity of a substrate, such as a photomask for semiconductor lithography. A substrate 107 (in this example, a photomask) may be placed on a holder on a movable XYZ stage 109. The system 100 may include a laser source, such as an ultra-short pulsed femtosecond laser 101, in which a computer or a central computerized control unit 121 may control the timing of pulses of the light source. The fundamental frequency of the laser pulse may be multiplied to higher harmonics by a harmonics generator 102, which may be also accompanied by a variable attenuator 103, for controlling output energy.

An attenuated laser beam is directed into a beam delivery system that is synchronized with laser pulses timing and with a 3-axis moving stage 109 by the central computerized control unit 121. Subsequently the beam is focused by a focusing optics (e.g. main objective lens 106) into the substrate of the photomask 107, to write pixels within the substrate. The same objective lens 106 may be used for an in-situ machine vision system, which acts as a microscope with high magnification. This microscope can be used for measuring pixel size and shape as well as monitoring of the laser breakdown process inside the substrate. It may also be used for accurately positioning the pixels at designated locations within the substrate. The photomask 107 is illuminated by a light source 113 via a light guide 110, and a variable aperture stop 111. The areas, shapes, and positions of the pixels are chosen to match the numerical aperture and illumination mode of the lithographic process, for which eventually the photomask 107 is used. Light may be collimated via a condenser lens onto the patterned layer 108 of the photomask 107.

An image is eventually formed via objective 106, beam-splitter 104, and a tube-lens 118, which directs the light to a charge coupled device (CCD) camera 119. An image may be grabbed by a continuous frame-grabber 120, and processed at the central computerized control unit 121. A UV source 116 provides UV light that is directed at the photomask 107, and a detection system 117 measures and reads the UV irradiation attenuation level of each area having pixels inside the substrate 107. An additional imaging system 115 (using light source 114) with low magnification, may be used for navigation across the photomask 107 and for determining coordinates of alignment marks, so CD variation tables which may contain XY alignment coordinates may be loaded to the computer 121, and match the laser patterning process.

In some implementations, the computer 121 can perform the processing of data described above, including calculations of various coefficients and parameters. The computer 121 can receive data about the angle-dependent scattering behavior of the pixel fields from a storage device, in which the data may be obtained from measurements of pixel fields using the ellipsometer. The computer 121 simulates the effects of the scanner and the effects of the pixels to determine the transfer coefficient, which is then used in the process of verifying whether the photomask has been corrected as described above. The characteristics of the scattering of the pixels are used in the simulation of the effects of the pixels.

The computer 121 can be implemented using a system that includes one or more processors and one or more computer-readable media (e.g., ROM, DRAM, SRAM, SDRAM, hard disk, optical disk, and flash memory). The one or more processors can perform various computations described above. The computations can also be implemented using application-specific integrated circuits (ASICs). The term "computer-readable medium" refers to a medium that participates in providing instructions to a processor for execution, including without limitation, non-volatile media (e.g., optical or magnetic disks), and volatile media (e.g., memory) and transmission media. Transmission media includes, without limitation, coaxial cables, copper wire, fiber optics and free space. The memory can include any type of memory, such as ROM, DRAM, SRAM, SDRAM, and flash memory.

The features described above can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, e.g., general purpose microprocessors, special purpose microprocessors, digital signal processors, single-core or multi-core processors, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM, DVD-ROM, and Blu-ray BD-ROM disks. The processor and the memory can be supplemented by, or incorporated in, ASICs (application-specific integrated circuits).

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Thus, particular embodiments of the subject matter have been described. Other embodiments are within the scope of the following claims. In some cases, the actions recited in the claims can be performed in a different order and still achieve desirable results.

What is claimed is:

1. A method for correcting the critical dimension uniformity (CDU) of a photomask for semiconductor lithography, the method comprising the following steps:
    determining a CDU to be corrected by way of a scanner-equivalent CDU measurement,
    determining a transfer coefficient as a calibration parameter,
    correcting the photomask by writing pixel fields,
    verifying the photomask corrected thus,
    wherein the transfer coefficient is used for verifying the corrected photomask, said transfer coefficient being obtained from a scattering function of pixel fields measured in advance,
    wherein determining the transfer coefficient comprises integrating the scattering function within the applicable integration limits for a mask metrology device, integrating the scattering function within the applicable integration limits for a scanner, and forming a quotient from a first result of integrating the scattering function within the applicable integration limit for the mask metrology device and a second result of integrating the scattering function within the applicable integration limit for the scanner.

2. The method according to claim 1, comprising verifying the photomask based on the transfer coefficient and an evaluation of a diffraction pattern caused by regular structures on the photomask.

3. The method according to claim 2, wherein the evaluation comprises a comparison of the absolute intensities of diffraction maximums before and after writing the pixel fields.

4. The method according to claim 1, wherein different illumination schemes for a mask metrology device and a scanner are taken into account when determining the transfer coefficient.

5. The method according to claim 1, comprising verifying the photomask based on the transfer coefficient and an evaluation of a diffraction pattern caused by regular structures on the photomask.

6. The method according to claim 1, comprising verifying the photomask based on the transfer coefficient and an evaluation of a diffraction pattern caused by regular structures on the photomask.

7. The method according to claim 1, wherein different illumination schemes for a mask metrology device and a scanner are taken into account when determining the transfer coefficient.

8. The method according to claim 1, wherein different illumination schemes for a mask metrology device and a scanner are taken into account when determining the transfer coefficient.

9. The method according to claim 2, wherein different illumination schemes for a mask metrology device and a scanner are taken into account when determining the transfer coefficient.

10. The method according to claim 3, wherein different illumination schemes for a mask metrology device and a scanner are taken into account when determining the transfer coefficient.

11. The method according to claim 1, comprising upon determining that the photomask has not been corrected according to specification, further correcting the photomask by writing a different set of pixel fields.

* * * * *